(12) United States Patent
Cho et al.

(10) Patent No.: US 10,714,479 B2
(45) Date of Patent: Jul. 14, 2020

(54) ONE-TRANSISTOR DRAM CELL DEVICE BASED ON POLYCRYSTALLINE SILICON WITH FINFET STRUCTURE AND FABRICATION METHOD THEREOF

(71) Applicants: Gachon University of Industry—Academic cooperation Foundation, Seongnam-si, Gyeonggi-do (KR); Ewha University—Industry Collaboration Foundation, Seodaemun-gu, Seoul (KR)

(72) Inventors: Seongjae Cho, Seoul (KR); Hyungsoon Shin, Seoul (KR)

(73) Assignees: GACHON UNIVERSITY OF INDUSTRY-ACADEMIC COOPERATION FOUNDATION (KR); EWHA UNIVERSITY—INDUSTRY COLLABORATION FOUNDATION (KR)

( * ) Notice: Subject to any disclaimer, the term of this patent is extended or adjusted under 35 U.S.C. 154(b) by 0 days.

(21) Appl. No.: 16/127,442

(22) Filed: Sep. 11, 2018

(65) Prior Publication Data

US 2019/0267381 A1 Aug. 29, 2019

(30) Foreign Application Priority Data

Feb. 28, 2018 (KR) .................. 10-2018-0024449

(51) Int. Cl.
*H01L 27/108* (2006.01)
*H01L 29/78* (2006.01)
(Continued)

(52) U.S. Cl.
CPC .... *H01L 27/10802* (2013.01); *H01L 21/0262* (2013.01); *H01L 21/02164* (2013.01); *H01L 21/02532* (2013.01); *H01L 21/02595* (2013.01); *H01L 21/26513* (2013.01); *H01L 21/308* (2013.01); *H01L 21/32133* (2013.01);
(Continued)

(58) Field of Classification Search
CPC .......... H01L 27/10802; H01L 29/0649; H01L 29/0847; H01L 21/26513; H01L 29/66795
See application file for complete search history.

(56) References Cited

FOREIGN PATENT DOCUMENTS

| KR | 10-2009-0011886 | * | 2/2009 |
| KR | 10-2017-0055031 | | 5/2017 |

OTHER PUBLICATIONS

Machine Translation of KR 10-2009-0011886 (Year: 2009).*

* cited by examiner

*Primary Examiner* — Anthony Ho
(74) *Attorney, Agent, or Firm* — Gerald E. Hespos; Michael J. Porco; Matthew T. Hespos

(57) ABSTRACT

The present invention provides a polysilicon-based 1T DRAM cell device having a FinFET structure and its fabrication method. In the present invention, a semiconductor layer (for example, a polysilicon layer) having a relatively low crystallinity is intentionally formed on the upper layer of the active fin to physically trap the holes accumulated in the conventional cell body, thereby remarkably improving the retention time. A polysilicon-based 1T DRAM cell device having a FinFET structure can also increase the operating efficiency by raising the gate's channel control force and implement the batch process with the functional blocks in the CPU that already have the FinFET structure.

7 Claims, 1 Drawing Sheet

(51) Int. Cl.
    *H01L 29/04*         (2006.01)
    *H01L 29/16*         (2006.01)
    *H01L 21/02*         (2006.01)
    *H01L 21/308*       (2006.01)
    *H01L 29/66*         (2006.01)
    *H01L 21/3213*      (2006.01)
    *H01L 21/265*       (2006.01)
    *H01L 29/08*         (2006.01)
    *H01L 29/06*         (2006.01)

(52) U.S. Cl.
    CPC ........ *H01L 27/10844* (2013.01); *H01L 29/04* (2013.01); *H01L 29/0649* (2013.01); *H01L 29/0847* (2013.01); *H01L 29/16* (2013.01); *H01L 29/66795* (2013.01); *H01L 29/785* (2013.01)

US 10,714,479 B2

ONE-TRANSISTOR DRAM CELL DEVICE BASED ON POLYCRYSTALLINE SILICON WITH FINFET STRUCTURE AND FABRICATION METHOD THEREOF

CROSS-REFERENCE TO RELATED APPLICATION

This application claims priority to Korean Patent Application No. 10-2018-0024449, filed on Feb. 28, 2018, under 35 U.S.C. 119, the entire contents of which are hereby incorporated by reference.

BACKGROUND

Field of the Invention

The present invention relates to a semiconductor memory device, and more particularly to a 1T DRAM cell device without a capacitor in a FinFET structure and a fabrication method thereof.

The dynamic random-access memory (DRAM) is currently a representative memory device in the field of semiconductor memory, along with NAND flash memory, which is a very competitive field of technology among leading semiconductor countries, including Korea.

Related Art

Conventional DRAM has a single transistor and one capacitor, that is, the 1T1C structure. Due to the complex process resulting from the presence of a capacitor, it is hard to be integrated with the CPU at the same time and should be produced and supplied by stand-alone type in most cases. Though it has the same ultra-fine semiconductor process with the flash memory device, the speed of the increase in memory capacity compared to the latter device is slow and the three-dimensional stacking is difficult. These problems have been pointed out as a technical limitation of DRAM having the 1T1C structure.

To solve these problems, although DRAMs of the capacitorless-1T structure have been proposed, their retention time is significantly shorter than the conventional 1T1C structure. In addition, in the case of Korean Patent Publication No. 10-2017-005503, it has problems that the gate's channel control force is low and that the possibility of a batch process with a functional block consisting of general MOSFET devices degrades using a tunneling field effect transistor (TFET).

SUMMARY

The present invention has been proposed to solve the problems of the above-described conventional 1T DRAM cell device, by intentionally forming a polysilicon region on the top of the channel area of the DRAM cell to physically capture and store the holes accumulated in the cell body so that retention time can be dramatically improved, and by raising the gate's channel control force with a FinFET structure to increase the operating efficiency and to implement the batch process with the functional blocks in the CPU that already have the FinFET structure. Therefore, the present invention is intended to provide a polysilicon-based 1T DRAM cell device having the FinFET structure and its fabrication method.

To achieve the objectives, a 1T DRAM cell device according to the present invention comprises a blocking insulating layer; a first semiconductor layer having a fin shape protruded on the blocking insulating layer; source and drain regions spaced apart by a channel region in the first semiconductor layer and having a conductivity type opposite to that of the channel region; a second semiconductor layer formed along the fin shape on the channel region; and a gate insulating film and a gate surrounding the channel region and the second semiconductor layer in a direction crossing the fin shape on the blocking insulating layer.

The second semiconductor layer may be a semiconductor material layer having a crystallinity equal to or lower than that of the first semiconductor layer.

The semiconductor material layer may be a silicon-based material layer.

The blocking insulating layer may be a silicon oxide film formed on a silicon substrate or a buried oxide film (BOX) of an SOI (Silicon-On-Insulator) substrate, the channel region may be doped with impurities such that a band-to-band tunneling occurs in the drain region when a write voltage is applied to the gate, and the second semiconductor layer may be a hole trapping layer that captures holes with a grain boundary.

The first semiconductor layer may be single crystal silicon, and the second semiconductor layer may be polysilicon.

A fabricating method of a 1T DRAM cell device according to an embodiment of the present invention comprises forming a silicon oxide film on a silicon substrate by a chemical vapor deposition or a thermal oxidation; depositing polysilicon on the silicon oxide film through a chemical vapor deposition process and then forming a crystalline silicon in a high temperature process to form a first semiconductor layer; depositing polysilicon on the first semiconductor layer through a chemical vapor deposition process to form a second semiconductor layer; forming an etching mask on the second semiconductor layer, sequentially etching the second semiconductor layer and the first semiconductor layer to form an active fin; forming a gate insulating film on the active fin; depositing a gate material on the gate insulating layer and etching the gate material to form a gate that surrounds the active fin in a direction crossing the active fin; and performing an ion implantation to form source and drain regions at both sides of the gate in the first semiconductor layer.

A fabricating method of a 1T DRAM cell device according to another embodiment of the present invention comprises using a single crystalline silicon layer of an SOI (Silicon-On-Insulator) substrate as a first semiconductor layer, forming a second semiconductor layer on the first semiconductor layer by depositing polysilicon through a chemical vapor deposition process; forming an etching mask on the second semiconductor layer, sequentially etching the second semiconductor layer and the first semiconductor layer to form an active fin; forming a gate insulating film on the active fin; depositing a gate material on the gate insulating layer and etching the gate material to form a gate that surrounds the active fin in a direction crossing the active fin; and performing an ion implantation to form source and drain regions at both sides of the gate in the first semiconductor layer.

A fabricating method of a 1T DRAM cell device according to another embodiment of the present invention comprises using a single crystalline silicon layer of an SOI (Silicon-On-Insulator) substrate as a first semiconductor layer, performing an ion implantation to the top of the first semiconductor layer to form a second semiconductor layer having a lower crystallinity than the first semiconductor layer; forming an etching mask on the second semiconductor layer, sequentially etching the second semiconductor layer and the first semiconductor layer to form an active fin; forming a gate insulating film on the active fin; depositing a gate material on the gate insulating layer and etching the gate material to form a gate that surrounds the active fin in a direction crossing the active fin; and performing an ion implantation to form source and drain regions at both sides of the gate in the first semiconductor layer.

The ion implantation to form the second semiconductor layer may be performed by implanting ions containing any one or more of Ar, C, and Si or by implanting a p-type dopant.

In the present invention, a semiconductor layer (e.g., a polysilicon layer) having a relatively low crystallinity is intentionally formed on the upper layer of the active fin to physically capture the holes accumulated in the conventional cell body, thereby remarkably improving the retention time. A polysilicon-based 1T DRAM cell device having a FinFET structure can also increase the operating efficiency by raising the gate's channel control force and implement the batch process with the functional blocks in the CPU that already have the FinFET structure.

In these drawings, the following reference numbers are used throughout: reference number 10 indicates a silicon substrate, 20 a blocking insulating layer (e.g., silicon oxide film, buried oxide film), 30 a first semiconductor layer (e.g., a single crystal silicon layer), 31 a channel region, 32 a source region, 34 a drain region, 40 a second semiconductor layer (e.g., a polysilicon layer), 50 a gate insulating film, and 60 a gate.

DETAILED DESCRIPTION

Detailed descriptions of preferred embodiments of the present invention are provided below with accompanying drawings.

Figure 1:
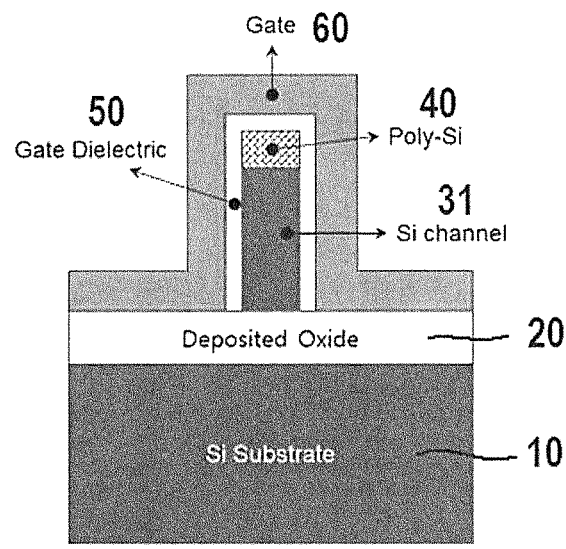
FIGS. 1 and 2 are a cross-sectional view showing the structure of the 1T DRAM cell device according to an embodiment of the present invention, the former shows a side cut in a direction crossing the gate and the latter shows a side cut in a channel direction.
Figure 2:
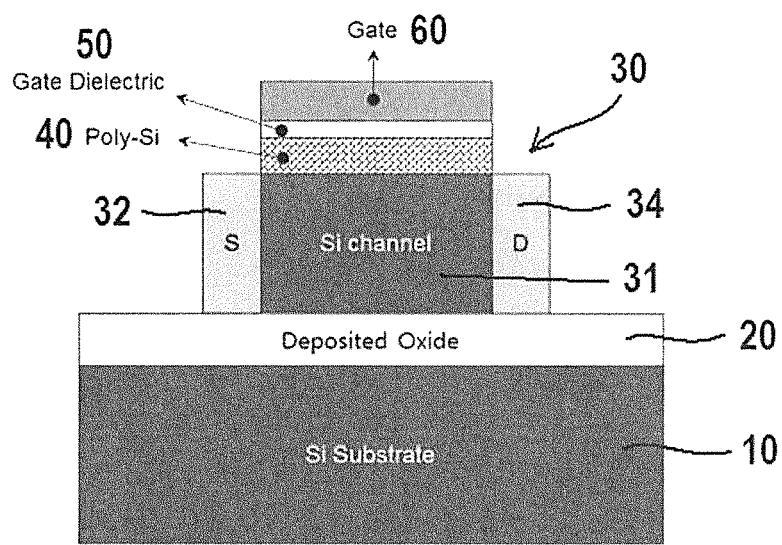

A 1T DRAM cell device according to the present invention comprises, as shown in FIGS. 1 and 2, a blocking insulating layer 20; a first semiconductor layer 30 having a fin shape protruded on the blocking insulating layer 20; source 32 and drain regions 34 spaced apart by a channel region 31 in the first semiconductor layer 30 and having a conductivity type opposite to that of the channel region 31; a second semiconductor layer 40 formed along the fin shape on the channel region 31; and a gate insulating film 50 and a gate 60 surrounding the channel region 31 and the second semiconductor layer 40 in a direction crossing the fin shape on the blocking insulating layer 20.

Here, the first semiconductor layer 30 and the second semiconductor layer 40 may form an active fin in which a cell device is fabricated. For example, a channel may be formed only in the first semiconductor layer 30 at a read operation, and the second semiconductor layer 40 may be a hole trapping layer in which holes of the channel are flowed and stored at a write operation. In other word, an active fin formed of semiconductor material may be divided into an upper hole trapping layer (i.e., the second semiconductor layer 40) and a lower channel region (i.e., the first semiconductor layer 30). As described later, the upper part of the active fin, the second semiconductor layer 40, is involved in a write operation and the lower part of the active fin, the first semiconductor layer 30, is involved in a read operation.

The hole trapping layer may be configured to capture and store holes at grain boundaries of the second semiconductor layer 40.

The blocking insulating layer 20 is to insulate the cell body, that is, the first semiconductor layer 30, to outside. Thus, the blocking insulating layer 20 may be formed of glass or a flexible material layer instead of the substrate 10 shown in FIG. 1, may be a silicon oxide film formed on the substrate 10. In another embodiment, the blocking insulating layer 20 may be a buried oxide film (BOX) of an SOI (Silicon-On-Insulator) substrate.

The channel region 31 may be doped with impurities such that band-to-band tunneling occurs in the drain region 34 when a write voltage (e.g., $V_{GS}<0$) is applied to the gate 60. For example, when the drain region 34 is n-type, the channel region 31 may be doped with p-type. The second semiconductor layer 40 may be a hole trapping layer that captures holes with grain boundaries as described above. By doing so, the second semiconductor layer 40 can physically capture many holes being in the channel region 31 of the first semiconductor layer 30, thereby improving the retention time.

The second semiconductor layer 40 may be formed by a heterojunction to the first semiconductor layer 30 with another semiconductor material layer or may be formed of the same semiconductor material layer as the first semiconductor layer 30. In any case, it is preferable that the crystallinity of the second semiconductor layer 40 is lower than that of the first semiconductor layer 30. By doing this, it is possible to increase the mobility of carriers (electrons or holes) in the channel region 31 of the first semiconductor layer 30 for the low power driving and to capture more holes into the grain boundaries of the second semiconductor layer 40 having a relatively lower crystallinity.

As a specific example, the first semiconductor layer 30 may be formed of crystalline silicon (e.g., single crystal silicon), and the second semiconductor layer 40 may be formed of low-crystalline silicon (e.g., polysilicon). Junctions of source 32 and drain regions 34 may be located under the second semiconductor layer 40. The second semiconductor layer 40 may be etched not to be electrically connected to the source 32 and drain regions 34 as shown in FIG. 2.

Next, a method for fabricating a 1T DRAM cell device having the structures of FIGS. 1 and 2 is described.

First, a silicon oxide film 20 is formed on a silicon substrate 10 by chemical vapor deposition (CVD) or thermal oxidation.

Then, a low-crystalline silicon-based material (e.g., polysilicon) is deposited on the silicon oxide film 20 by a chemical vapor deposition method and then the low-crystalline silicon-based material is grown into a crystalline silicon to form a first semiconductor layer (30) by a high temperature process (700 to 900° C.).

Thereafter, a low-crystalline silicon-based material (e.g., polysilicon) is once more deposited on the first semiconductor layer 30 through a chemical vapor deposition to form a second semiconductor layer 40. An etching mask is formed on the semiconductor layer 40, and then the second semiconductor layer and the first semiconductor layer are sequentially etched to form an active fin.

Next, a gate insulating film 50 is formed on the active fin, a gate material is deposited on the gate insulating film, and the gate material is etched to form a gate 60 surrounding the active fin in a direction intersecting with the active fin. And an ion implantation is performed to form source 32 and drain regions 34 at both sides of the gate 60 in the first semiconductor layer 30.

In another embodiment, when an SOI (Silicon-On-Insulator) substrate is used in place of the silicon substrate 10, a single crystal silicon layer of the SOI substrate may be used as the first semiconductor layer 30, polysilicon is deposited by a chemical vapor deposition to form a second semiconductor layer 40, and the subsequent steps can proceed in the same manner as the above example.

In this case, the buried oxide film (BOX) of the SOI substrate can be used in place of the silicon oxide film 20, and the process steps can be reduced.

In another embodiment, when the SOI substrate is used, instead of the step of forming the second semiconductor layer 40 with polysilicon, a step of performing an ion implantation to the top of the first semiconductor layer 30, which is a single crystal silicon layer of the SOI substrate, may proceed to form the second semiconductor layer 40 having a lower crystallinity than the first semiconductor layer 30.

In this case, it is preferable that the ion implantation is performed by implanting ions containing any one or more of Ar, C, and Si or by implanting a p-type dopant so that the second semiconductor layer 40 is not an n-type conductivity type.

Finally, an operation method of the 1T DRAM cell device according to the embodiment of FIGS. 1 and 2 is briefly described.

<Write Operation>

When the body voltage applied to the silicon substrate 10 $V_B=0$, the source voltage applied to the source area 32 $V_S=0$, the voltage between gate and source $V_{GS}<0$, and the voltage between drain and source $V_{DS}>0$, respectively, the electrons in a valence band of the p-type channel region 31 move to the drain region 34 by a band-to-band tunneling.

At this time, free holes are formed in the p-type channel region. The free electrons are effectively trapped in the floating body of the channel region 31 by the negative voltage applied to the gate 60 existing in the sidewall. Some of free electrons trapped in the floating body are introduced into the polysilicon region of the second semiconductor layer 40, captured and stored in the grain boundaries of polysilicon. The grain boundaries form a hole trapping layer, which is written in the 0 or 1 state depending on the degree of trapping of the holes by the trapping layer.

<Read Operation>

The state of the memory device 0 or 1 can be determined by applying $V_B=0$, $V_S=0$, $V_{GS}>V_{th}$ (threshold voltage of the MOSFET), and $V_{DS}>0$.

In this case, if $V_{DS}$ is excessively high, additional electron and hole pairs are generated due to impact ionization. If $V_{GS}$ is excessively high, the holes trapped in the polysilicon region are escaped and it becomes difficult to accurately determine the memory state. It should be applied with a properly sized $V_{DS}$ and $V_{GS}$.

<Erase Operation>

The remaining holes without recombination and the holes trapped in the polysilicon region are removed by drifting to the source region by applying voltages of $V_B=0$, $V_S=0$, $V_{GS}>0$ and $V_{DS}>0$. Alternatively, by applying $V_S<0$, $V_G>0$, and $V_D<0$, holes can be driven out by both the source and drain junctions to improve the erase speed.

In the read and erase operations, except for the write operation, it is desirable that $V_G$ is set to a positive value to prevent unwanted trapping of holes into the polysilicon region.

In order to allow the polysilicon region to participate in the write operation and to perform the read operation in the channel region underneath, it is preferable to form the S/D junctions in the lower portion of the polysilicon and to etch so as to have a structure as shown FIG. 2.

This work was supported by the Ministry of Trade, Industry & Energy (MOTIE) of Korea and the Korea Semiconductor Research Consortium (KSRC) for the development of the future semiconductor devices (Grant No. 10080513).

What is claimed is:

1. A 1T DRAM cell device comprising:
   a blocking insulating layer;
   a first semiconductor layer having a fin shape protruded on the blocking insulating layer; source and drain regions spaced apart by a channel region in the first semiconductor layer and having a conductivity type opposite to that of the channel region;
   a second semiconductor layer formed along the fin shape on the channel region; and
   a gate insulating film and a gate surrounding the channel region and the second semiconductor layer in a direction crossing the fin shape on the blocking insulating layer,
   wherein the second semiconductor layer is a semiconductor material layer having a crystallinity equal to or lower than that of the first semiconductor layer.

2. The 1T DRAM cell device of claim 1, wherein the semiconductor material layer is a silicon-based material layer.

3. The 1T DRAM cell device of claim 2, where the blocking insulating layer is a silicon oxide film formed on a silicon substrate or a buried oxide film (BOX) of an SOI (Silicon-On-Insulator) substrate, where the channel region is doped with impurities such that a band-to-band tunneling occurs in the drain region when a write voltage is applied to the gate, and where the second semiconductor layer is a hole trapping layer that captures holes with a grain boundary.

4. The 1T DRAM cell device of claim 3, wherein the first semiconductor layer is a single crystal silicon, and wherein the second semiconductor layer is polysilicon.

5. The 1T DRAM cell device of claim 1, where the blocking insulating layer is a silicon oxide film formed on a silicon substrate or a buried oxide film (BOX) of an SOI (Silicon-On-Insulator) substrate, where the channel region is doped with impurities such that a band-to-band tunneling occurs in the drain region when a write voltage is applied to the gate, and where the second semiconductor layer is a hole trapping layer that captures holes with a grain boundary.

6. The 1T DRAM cell device of claim 5, wherein the first semiconductor layer is a single crystal silicon, and wherein the second semiconductor layer is polysilicon.

7. A 1T DRAM cell device comprising:
   a blocking insulating layer;
   a first semiconductor layer having a fin shape protruded on the blocking insulating layer; source and drain regions spaced apart by a channel region in the first semiconductor layer and having a conductivity type opposite to that of the channel region;
   a second semiconductor layer formed along the fin shape on the channel region; and a gate insulating film and a gate surrounding the channel region and the second semiconductor layer in a direction crossing the fin shape on the blocking insulating layer, where the blocking insulating layer is a silicon oxide film formed on a silicon substrate or a buried oxide film (BOX) of an SOI (Silicon-On-Insulator) substrate, where the channel region is doped with impurities such that a band-to-band tunneling occurs in the drain region when a write voltage is applied to the gate, and where the second semiconductor layer is a hole trapping layer that captures holes with a grain boundary, and wherein the first semiconductor layer is a single crystal silicon, and wherein the second semiconductor layer is polysilicon.

* * * * *